US008658999B2

United States Patent
Nishi et al.

(10) Patent No.: US 8,658,999 B2
(45) Date of Patent: Feb. 25, 2014

(54) SEMICONDUCTOR DEVICE

(71) Applicants: Yoshifumi Nishi, Niigata (JP); Takao Marukame, Kanagawa (JP); Takayuki Ishikawa, Kanagawa (JP); Masato Koyama, Kanagawa (JP)

(72) Inventors: Yoshifumi Nishi, Niigata (JP); Takao Marukame, Kanagawa (JP); Takayuki Ishikawa, Kanagawa (JP); Masato Koyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/728,552

(22) Filed: Dec. 27, 2012

(65) Prior Publication Data

US 2013/0234088 A1 Sep. 12, 2013

(30) Foreign Application Priority Data

Mar. 8, 2012 (JP) ................................. 2012-052186

(51) Int. Cl.
*H01L 29/02* (2006.01)
(52) U.S. Cl.
USPC ..... 257/2; 257/3; 257/4; 257/5; 257/E29.002; 438/102; 438/103; 438/104
(58) Field of Classification Search
USPC .................. 257/2–5, E29.002; 438/102–104
See application file for complete search history.

(56) References Cited

U.S. PATENT DOCUMENTS

2009/0179245 A1 7/2009 Karg et al.

OTHER PUBLICATIONS

Jang et al.; "Spin Transport in Memristive Devices", Applied Physics Letters, vol. 100, pp. 043510-1-043510-4, (2012).
Kuekes et al.; "The Crossbar Latch: Logic Value Storage, Restoration, and Inversion in Crossbar Circuits", J. Applied Physics, vol. 97, pp, 034301-1-034301-5, (2005).
Nishi et al.; "Memristive Properties of Calcium Fluoride Thin Films", The Japan Society of Applied Physics, the 59$^{th}$ Spring Meeting, p. 1, (2012).

*Primary Examiner* — Jami M Valentine
(74) *Attorney, Agent, or Firm* — Finnegan, Henderson, Farabow, Garrett & Dunner, L.L.P.

(57) ABSTRACT

According to an embodiment, a semiconductor device includes first and second memristors. The first memristor includes a first electrode made of a first material, a second electrode made of a second material, and a first resistive switching film arranged between the first and second electrodes. The first resistive switching film is connected to both the first and second electrodes. The second memristor includes a third electrode made of a third material, a fourth electrode made of the second material, and a second resistive switching film arranged between the third and fourth electrodes. The second resistive switching film is connected to both the third and fourth electrodes. The work function of the first material is smaller than that of the second material. The work function of the third material is larger than that of the second material.

8 Claims, 15 Drawing Sheets

BIRD'S EYE VIEW

PLAN VIEW

SEMICONDUCTOR DEVICE

CROSS-REFERENCE TO RELATED APPLICATION

This application is based upon and claims the benefit of priority from Japanese Patent Application No. 2012-052186, filed on Mar. 8, 2012; the entire contents of which are incorporated herein by reference.

FIELD

Embodiments described herein relate generally to a semiconductor device.

BACKGROUND

Memristors have been attracting much attention in recent discussions on the post scaling technology. A memristor is a passive two-terminal element having a resistance changing with the current flowing through the element or the voltage applied to the element. A meraristor has a simple structure in which a resistive switching film of a transition metal oxide, chalcogenide or the like is arranged between an upper electrode and a lower electrode. In particular, a cross-point memristor array in which resistive switching film is arranged between a word line electrode and a bit line electrode and in which memristors are formed at intersections of word lines and bit lines can be easily processed on a CMOS circuit, has scalability and circuit plasticity, and on the basis of such advantages, is expected as a new technology that combines logic with memory.

As an example of a basic circuit component composed of cross-point memristors, a latch circuit including memristors A and B that operate complementerily to each other (nave opposite switch polarities). For example, in a structure in which one electrode of the memristor A and one electrode of the memristor B are connected to the same lead wire, when a positive voltage is applied to the lead wire, one memristor changes to a low resistance state (which may be referred to as "closed" in the description below) and the other memristor changes to a high resistance state (which may be referred to as "open" in the description below). When a negative voltage is applied to the lead wire, on the other hand, one memristor changes to a high resistance state and the other memristor changes to a low resistance state.

To realize memristors having opposite switch polarities in the related art, however, there is a disadvantage that it is required to take measures for wiring in such a manner that a lower electrode of one memristor is wired to an upper electrode of the other memristor, which results in a complex structure.

DETAILED DESCRIPTION

According to an embodiment, a semiconductor device includes a first memristor and a second memristor. The first memristor includes a first electrode made of a first material, a second electrode made of a second material, and a first resistive switching film arranged between the first electrode and the second electrode. The first resistive switching film is connected to the first electrode and the second electrode. The second memristor includes a third electrode made of a third material, a fourth electrode made of the second material, and a second resistive switching film arranged between the third electrode and the fourth electrode. The second resistive switching film, is connected to the third electrode and the fourth electrode. A work function of the first material is smaller than a work function of the second material. A work function of the third material is larger than the work function of the second material.

Figure 1:
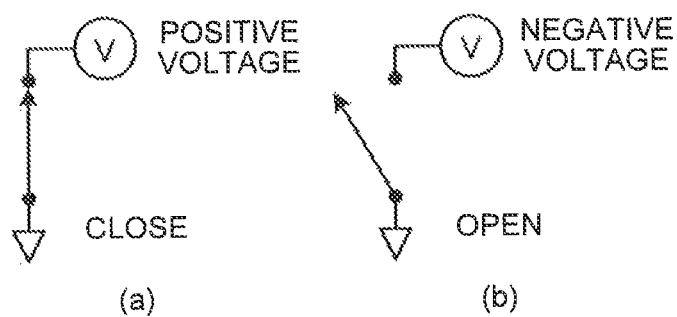
FIG. 1 is a diagram for explaining memristors according to embodiments.

Embodiments of a semiconductor device will be described in detail below with reference to the accompanying drawings. A latch circuit will be described below as an example of a semiconductor device including two memristors that operate complementerily to each other, but the semiconductor device is not limited thereto. In circuit diagrams of the present specification, memristors are represented by arrows as in FIG. 1. As illustrated in (a) of FIG. 1, directions of the arrows are defined so that heads of the arrows point towards one electrode when a positive voltage is applied to the electrode and a memristor becomes "closed". The state "closed" is represented by a diagram in which a head of an arrow is connected to an electrode. As illustrated in (b) of FIG. 1. the state "open" is represented by a diagram in which a head of an arrow is disconnected from an electrode.

First Embodiment

Figure 2:
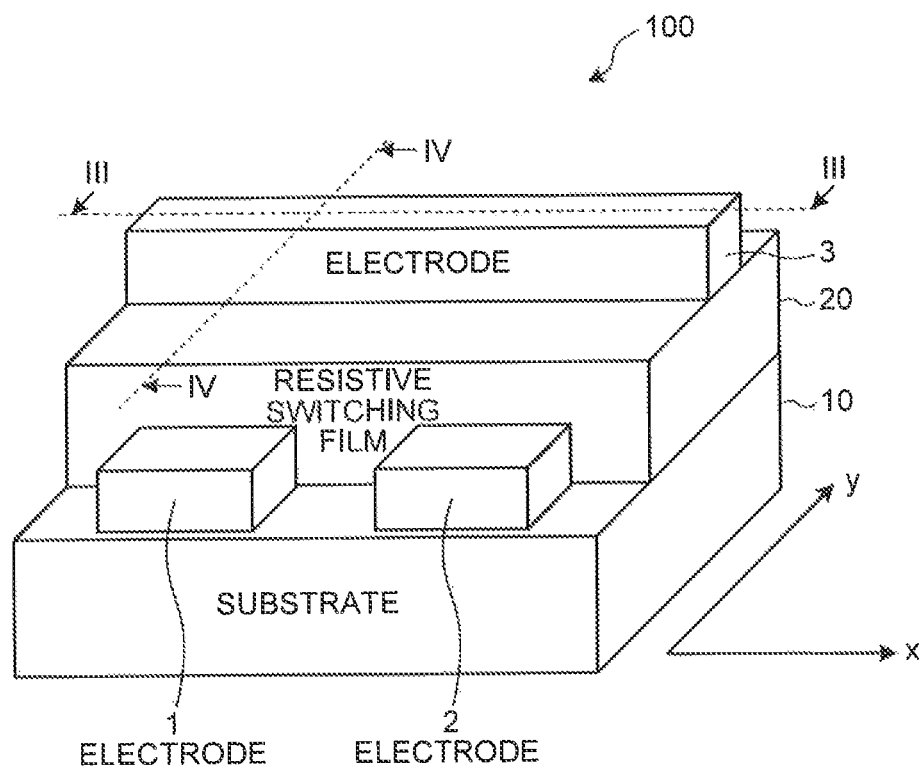
FIG. 2 is a bird's eye view illustrating an exemplary structure of a latch circuit according to a first embodiment.
Figure 3:
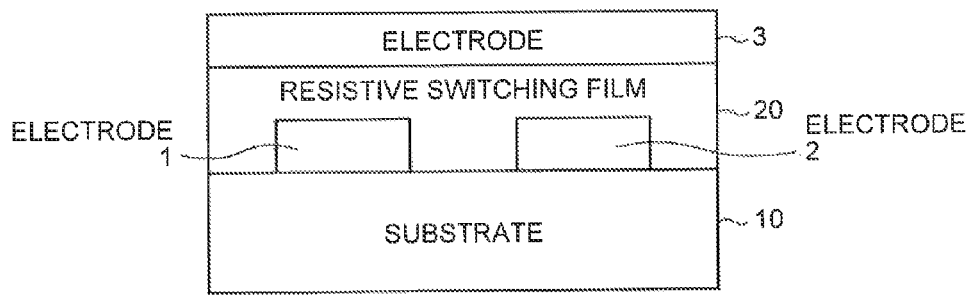
FIG. 3 is a sectional view of the latch circuit taken along line III-III of FIG. 1.
Figure 4:
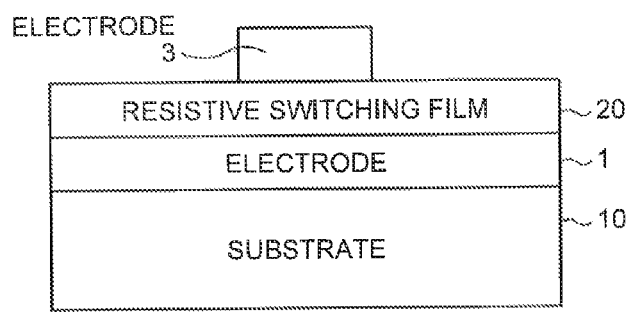
FIG. 4 is a sectional view of the latch circuit taken along line Iv-IV of FIG. 1.

FIG. 2 is a bird's eye view illustrating an exemplary structure of a latch circuit 100 according to the present embodiment. As illustrated in FIG. 2, an electrode 1 and an electrode 2 extending parallel to each other along a Y direction in FIG. 2 are formed on a surface of a substrate 10, Furthermore, a resistive switching film 20 is formed to cover both, of the electrode 1 and the electrode 2, and an electrode 3 extending along an X direction perpendicular to the Y direction is formed on an upper surface of the resistive switching film 20. When viewed in a direction perpendicular to the surface of the substrate 10 (the normal direction of the substrate 10), the electrode 3 intersects each of the electrode 1 and the electrode 2. A section taken along line III-III in the exemplary structure of FIG. 2 is illustrated in FIG. 3, and a section taken along line IV-IV therein is illustrated in FIG. 4.

Figure 5:
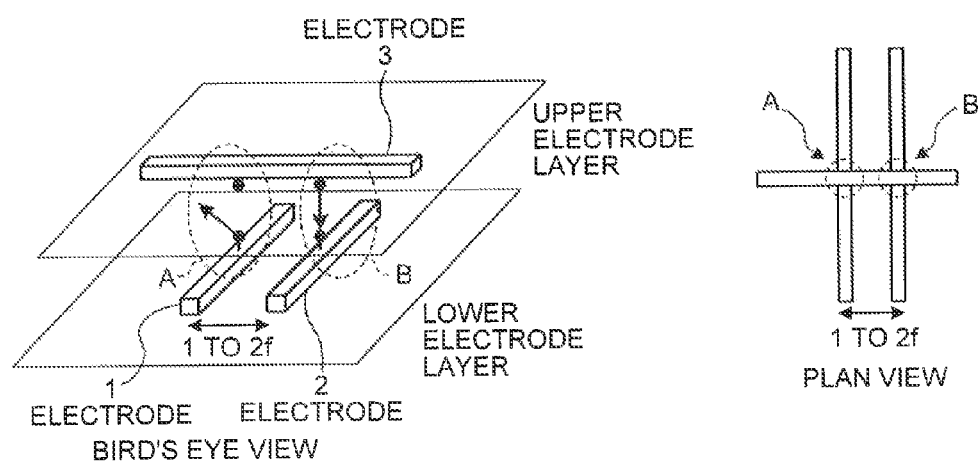
FIG. 5 is a conceptual diagram of a structure of the latch circuit according to the first embodiment.

FIG. 5 is a conceptual diagram of the structure of the latch circuit 100. In this example, a layer in which the electrode 1 and the electrode 2 are formed will be referred to as a "Mower electrode layer" and a layer in which the electrode 3 is formed will be referred to as an "upper electrode layer".

As illustrated, in FIG. 5, the electrode 3 and the electrode 1 have the resistive switching film 20 therebetween at the intersection thereof to form a memristor A. In other words, the memristor A can be regarded as including the electrode 1, the electrode 3, and the resistive switching film 20. The resistive switching film 20 is arranged between the electrode 1 and the electrode 3, and is connected to both of the electrode 1 and the electrode 3. In this example, the electrode 1 functions as a lower electrode of the memristor A and the electrode 3 functions as an upper electrode of the memristor A.

In addition, as illustrated in FIG. 5, the electrode 3 and the electrode 2 have the resistive switching film 20 therebetween at the intersection thereof to form a memristor B. In other words, the memristor B nun be regarded as including the electrode 2, the electrode 3, and the resistive switching film 20. The resistive switching film 20 is arranged between the electrode 2 and the electrode 3, and is connected to both of the electrode 2 and the electrode 3. In this example, the electrode 2 functions as a lower electrode of the memristor B and the electrode 3 functions as an upper electrode of the memristor B, Furthermore; in this example, one electrode (the upper electrode in this example) of the memristor A and one electrode of the memristor B can be regarded, as being formed, integrally.

Still further, in this example, the electrode 1, the electrode 2. and the electrode 3 also function as wires, but the structure is not limited thereto and the electrodes (the upper electrodes or the lower electrodes) of the respective memristors (A, B) and wires connected therewith may be formed separately. In this case, the materials of the memristors (A, B) and those of the wires may be either the same or different. A case in which the electrodes of the memristors also function as wires as in the present embodiment, however, is advantageous in that the manufacture is easier than a case in which the electrodes and the wires are formed separately.

In the present embodiment, the materials of the electrodes are selected so that the relation (the work function of the electrode 1)<(the work function of the electrode 3)<(the work function of the electrode 2) is satisfied. Specific details will be hereinafter described. In the following description; the material of the electrode 1, the material of the electrode 3, and the material of the electrode 2 may be referred to as a "first material", a "second material", and a "third material", respectively.

The second material (the material of the electrode 3) may be metal, for example. In the present embodiment, the electrode 3 is made of silver (Ag). The first material (the material of the electrode 1) may be a semiconductor, for example. In the present embodiment, the electrode 1 is made of n-type silicon (hereinafter referred to as "n$^+$Si" that is silicon added with a quinquevalent element such as arsenic as an impurity. The third material (the material of the electrode 2) may be a semiconductor, for example. In the present embodiment, the electrode 2 is made of p-type silicon (hereinafter referred to as "p$^+$Si" that is silicon added with a trivalent element such as boron as an impurity.

The resistive switching film 20 is a thin film containing mobile ions and can be made of an ion conductor, for example. Examples of the ion conductor include a metal halide such as a metal fluoride. In the present embodiment, the resistive switching film 20 is made of a $CaF_2$ thin film of about 10 to 100 nanometers (nm). Call has a structure in which an F ion is present at the center of a regular tetrahedral lattice of Ca ions. $CaF_2$ contains a number of F deficiencies that are partially deficient F ions behaving as cations. F deficiencies have a low migration energy of about 0.5 eV and can move relatively freely in regular tetrahedral Ca crystals. Accordingly, the distribution of F deficiencies is changed the internal electric field of $CaF_2$. Note that the material of the resistive switching film 20 may be any type of material as long as functions of memristors can be realized in cooperation with the upper and lower electrode materials. Examples of materials having properties similar to those of $CaF_2$ include metal halides such as $SrF_2$, $BaF_2$, $SrCl_2$ and $PbF_2$, and in addition, transition metal oxides such as $ZrOx$, $TiOx$, $HfOx$, $NiO$ and $TaOx$, metal oxides such as $AlOx$ and $MgO$, semiconductor oxides such as $SiGx$, sulfides such as $Ag_2S$, $CuS$, $Ag_2Se$, $CuSe$, $GeS$ and $GeSe$, and selenides (chalcogenide). In the following, unless otherwise specified, an example in which the resistive switching film 20 is made of $CaF_2$ will be described.

Figure 6:
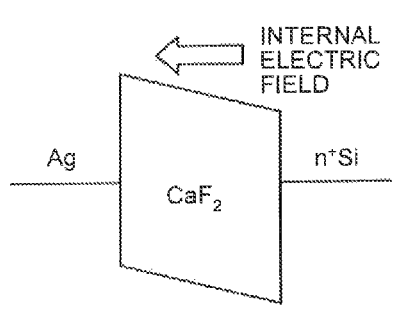
FIG. 6 is a diagram illustrating an internal electric field of memristor P according to the first embodiment.

Next, exemplary operations of the memristors (A, B) will be described. First, an exemplary operation of the memristor A will be described with reference to FIGS. 6 to 8. As described above, the work function (4.1 eV) of n$^+$Si that is a material of the electrode 1 is smaller than that (4.3 eV) of Ag that is a material of the electrode 3. As illustrated in FIG. 6, an electric field is generated inside $CaF_2$ because of the difference between the work functions (so that Fermi surfaces are aligned), and cations are attracted toward Ag while anions are attracted toward n$^+$Si. This internal electric field changes the distribution of F deficiencies.

Figure 7:
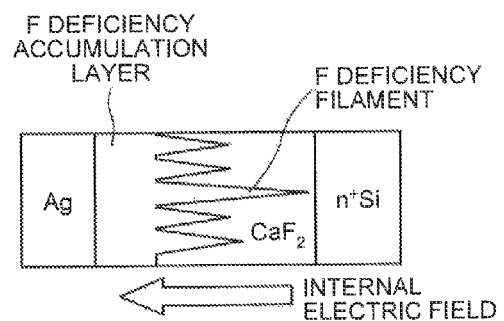
FIG. 7 is a diagram illustrating an F deficiency accumulation layer of memristor A according to the first embodiment.

As illustrated in FIG. 7, F deficiencies behaving as cations are accumulated at an interface between CaF$_2$ and Ag (an interface between the resistive switching film 20 and the electrode 3) to form an F deficiency accumulation layer. The F deficiency accumulation layer is called a virtual cathode because the F deficiency accumulation layer has a high conductivity and behaves as an electrode. Since the F deficiency accumulation layer is a layer resulting from accumulation in a relatively modest internal electric field, the concentration thereof becomes gradually lower toward n$^+$Si (toward the electrode 1), while some F deficiencies extend like a filament very close to the interface between CaF$_2$ and n$^+$Si as illustrated in FIG. 7 (referred to as an "F deficiency filament" in FIG. 7).

When a negative voltage bias is applied to Ag, the F deficiency filament extending close to the interface between CaF$_2$ and n$^+$Si is negatively charged, attracting more F deficiencies to grow until the leading end thereof reaches the interface between CaF$_2$ and n$^+$Si. Then, the system makes a rapid transition to a low resistance state (closed), When a positive voltage bias is applied to Ag, on the other hand, the F deficiency accumulation layer is positively charged, the leading end of the filament is therefore decomposed getting away from the interface between CaF$_2$ and n$^+$Si, and the system makes a transition to a high resistance state (open).

Figure 8:
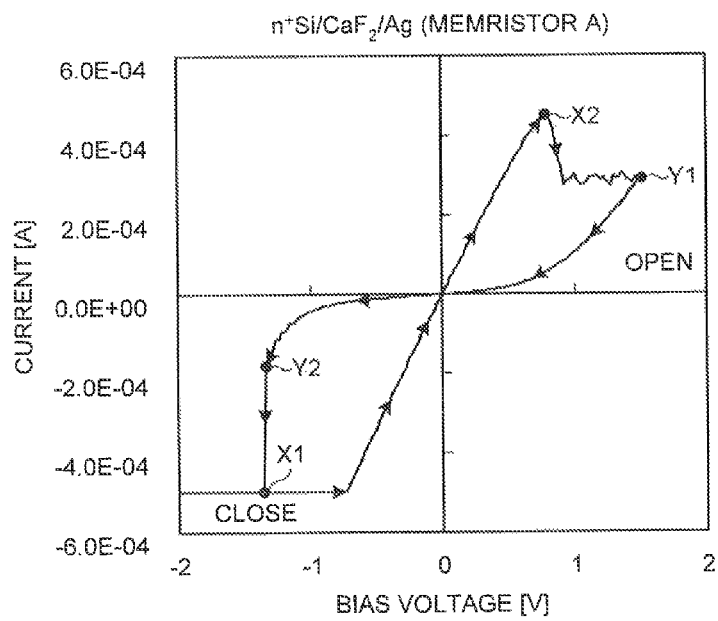
FIG. 8 is a graph illustrating current-voltage characteristics of memristor A according to the first embodiment.

FIG. 8 illustrates current-voltage characteristics of the memristor A that are actually measured. The horizontal axis thereof represents the voltage applied to the electrode 3 (Ag). Arrows in FIG. 8 represent the directions of current variations with voltage sweep. In FIG. 8, a section from X1 to X2 represents a closed section and a section from Y1 to Y2 represents an open section. As described above, it is found that, when a negative voltage bias is applied to the electrode 3 (Ag), the leading end of the F deficiency filament grows, the current suddenly increases and the system becomes a low resistance state (closed). It is also found that, when the voltage bias to be applied to the electrode 3 (Ag) is changed to positive, the leading end of the F deficiency filament is decomposed, the current is lowered, and the system becomes a high resistance state (open).

Figure 9:
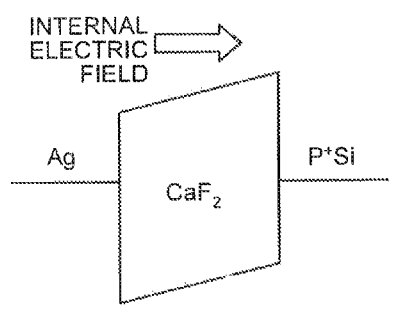
FIG. 9 is a diagram illustrating an internal electric field of memristor B according to the first embodiment.

Next, an exemplary operation of the memristor B will be described with reference to FIGS. 9 to 11. Since the work function (5.2 eV) of p$^+$Si that is a material of the electrode 2 is larger than that (4.3 eV) of Ag that is a material of the electrode 3 as described above, a phenomenon exactly opposite to the case of the memristor A will occur. As illustrated in FIG. 9, an electric field is generated inside CaF$_2$ because of the difference in the work function between the electrode 2 and the electrode 3 (so that Fermi surfaces are aligned), and cations are attracted toward p$^+$Si while anions are attracted, toward Ag. This internal electric field changes the distribution of F deficiencies.

Figure 10:
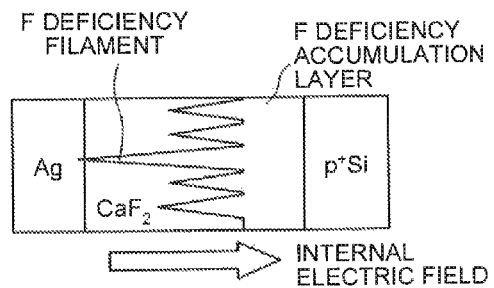
FIG. 10 is a diagram illustrating an F deficiency accumulation layer of memristor B according to the first embodiment.

As illustrated in FIG. 10, F deficiencies behaving as cations are accumulated at an interface between CaF$_2$ and p$^+$Si (an interface between the resistive switching film 20 and the electrode 2) to form an F deficiency accumulation layer. Since the F deficiency accumulation layer is a layer resulting from accumulation, in a relatively modest internal electric field, the concentration thereof becomes gradually lower toward Ag (toward the electrode 3), while the F deficiency filament extends very close to the interface between CaF$_2$ and Ag as illustrated in FIG. 10.

When a positive voltage bias is applied to Ag, this means that p$^+$Si is applied with a relatively negative voltage bias, and the F deficiency filament extending close to the interface between CaF$_2$ and Ag is therefore negatively charged, attracting more F deficiencies to grow until the leading end thereof reaches the interface between CaF$_2$ and Ag. Then, the system makes a rapid transition to a low resistance state (closed). When, a negative voltage bias is applied to Ag, on the other hand, this means that a relatively positive voltage bias is applied to p$^+$Si, the F deficiency accumulation layer is therefore positively charged, the leading end of the filament is therefore decomposed getting away from the interface between CaF$_2$ and Ag, and the system makes a transition, to a high resistance state (open).

Figure 11:
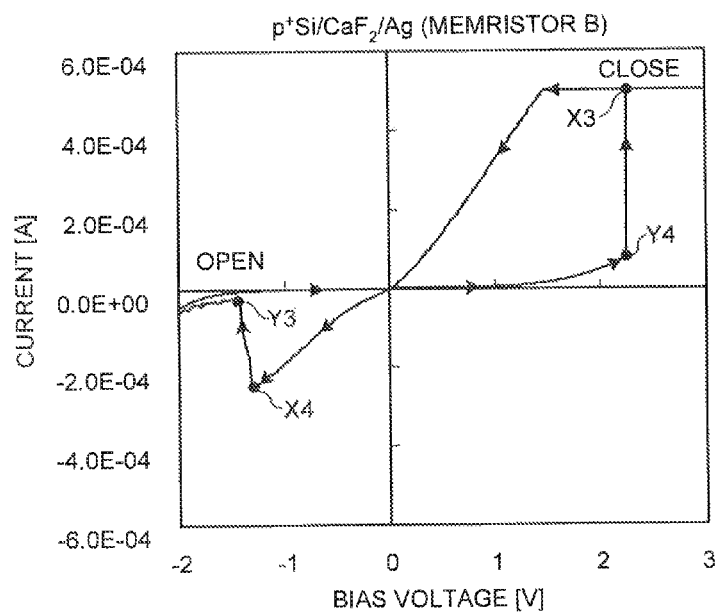
FIG. 11 is a graph illustrating current-voltage characteristics of memristor 3 according to the first: embodiment.

FIG. 11 illustrates current-voltage characteristics of the memristor B that are actually measured. The horizontal axis thereof represents the voltage applied to the electrode 3 (Ag). Arrows in FTG. 11 represent the directions of current variations with voltage sweep. In FIG. 11, a section from X3 to X4 represents a closed section and a section from Y3 to Y4 represents an open section. As described above, it is found that, when a positive voltage bias is applied to the electrode 3 (Ag), the leading end of the F deficiency filament grows, the current suddenly increases and the system becomes a low resistance state (closed). It is also found that, when the voltage bias to applied to the electrode 3 (Ag) is changed to negative, the leading end of the F deficiency filament is decomposed, the current is lowered, and the system, becomes a nigh resistance state (open), As a result, when a negative voltage bias is applied to the electrode 3, the memristor A makes a transition to closed and the memristor B makes a transition to open. When a positive voltage bias is applied to the electrode 3, on the other hand, the memristor P makes a transition to open and the memristor B makes a transition to closed. Thus, the memristor A and the memristor B operate complementarily to each other (have polarities opposite to each other).

Herein, when a negative voltage bras is applied to the electrode 3, the polarity of the potential difference between the upper electrode (the electrode 3) and the lower electrode (the electrode 1 or the electrode 2) of each memristor is negative, while when a positive voltage bias is applied to the electrode 3, the polarity of the potential difference between the upper electrode and the lower electrode of each memristor is positive. Specifically, the memristor A becomes closed when the polarity of the potential difference between the upper electrode and the lower electrode is negative, while the memristor A becomes open when the polarity of the potential difference between the upper electrode and the lower electrode is positive. On the other hand, the memristor 3 becomes open when the polarity of the potential difference between the upper electrode and the lower electrode is negative, while the memristor B becomes closed when the polarity of the potential difference between the upper electrode and the lower electrode is positive.

In this example, the memristor A may be referred to as the "first memristor", and the memristor B may be referred to as the "second memristor". The electrode 1 may be referred to as the "first electrode", the electrode 2 may be referred co as the "third electrode", the electrode 3 may be referred to as the "second electrode" and the "fourth electrode", and the resistive switching film 20 may be referred to as the "first resistive switching film" and the "second resistive switching film". Furthermore, the "negative polarity" may be referred to as the "first polarity", and the "positive polarity" may be referred to as the "second polarity".

The manner in which the polarity of the potential difference between the upper electrode and the lower electrode of each memristor is determined is not limited to what has been described above. For example, the polarity may be determined such that, when a negative voltage bias is applied to the electrode 3, the polarity of the potential difference between the upper electrode and the lower-electrode of each memristor is positive, while when a positive voltage bias is applied to the electrode 3, the polarity of the potential difference between the upper electrode and the lower electrode of each memristor is negative. In this case, the memristor A becomes closed when the polarity of the potential difference between the upper electrode and the lower electrode is positive, while the memristor A becomes open when the polarity of the potential difference between the upper electrode and the lower electrode is negative. On the other hand, the memristor B becomes open when the polarity of the potential difference between, the upper electrode and the lower electrode is positive, while the memristor B becomes closed, when the polarity of the potential difference between the upper electrode and the lower electrode is negative. In this case, the "positive polarity" may he referred to as the "first polarity", and the "negative polarity" may be referred to as the "second polarity".

As described above, the latch circuit 100 according to the present embodiment includes the memristor A including the electrode 1 that functions as the lower electrode, the electrode 3 that functions as the upper electrode, and the resistive switching film 20 arranged between the electrode 1 and the electrode 3, and includes the memristor B including the electrode 2 that functions as the lower electrode, the electrode 3 that functions as the upper electrode, and the resistive switching film 20 arranged between the electrode 2 and the electrode 3. In addition, as a result of selecting the materials of the electrodes so that the relation (the work function of the material of the electrode 1)<(the work function of the material of the electrode 3)<(the work function of the material of the electrode 2) is satisfied, the memristors A and the memristor B can be made to operate complementarity to each other.

In the present embodiment, as will be described later, since two memristors that operate complementarity to each other can be formed on the substrate 10 through processes of (1) forming the lower electrodes (the electrode 1 and the electrode 2) of the respective memristors on the substrate 10, (2) forming the resistive switching film 20 that covers the memristors, and (3) forming the shared upper electrode (the electrode 3) on the upper surface of the resistive switching film 20, it is not required to take such measures as wiring the lower electrode of one memristor to the upper electrode of the other memristor. Thus, according to the present embodiment, memristors that operate complementarily to each other can be realized with a simple structure.

While the material (first material) of the electrode 1 is rd$^+$Si, the material (third material) of the electrode 2 is p$^+$Si, and the material (second material) of the electrode 3 is Ag in the present embodiment, other combinations of materials may be employed as long as the relation of work functions mentioned above is satisfied.

Note that the materials of the electrode 1 and the electrode 2 are preferably not easily ionizable. A heavily-doped semiconductor is one example of electrode materials that are not easily ionizable. Since the work function of a semiconductor can be adjusted by the type and the concentration of impurities to be doped therein, it is possible to control the difference between the work functions by using the same semiconductor material (such as silicon) for both the electrode 1 and the electrode 2 and then adding (doping) impurities thereto. In general, if different materials are used for the electrode 1 and the electrode 2, the properties specific to the materials are also different in addition to the work function, and therefore the circuit may not necessarily operate as intended. For example, if the materials have different ionization tendencies, it is necessary to consider the oxidation-reduction potential in addition to the work function. When the same semiconductor material is used, for both of the electrode 1 and the electrode 2, on the other hand, it is possible to make the work functions thereof different by only changing the doping condition, and eliminate unnecessary design factors due to properties specific to the respective materials of the electrode 1 and the electrode 2.

Examples of the semiconductor materials used for the electrodes may include, in addition to silicon (Si), group-IV semiconductors such as Ge, SiGe and SiC, or compound semiconductors such as GaAs, GaSb, InP, InAs and InSb. A large bandgap is preferable for making the work functions of the electrode 1 and the electrode 2 different, and semiconductors having bandgaps of 1 eV or larger such as silicon (bandgap; 1.1 eV), SiC (3.2 eV), InP (1.4 eV) and GaAs (1.5 eV) are preferable considering the operating voltage of typical LSIs.

The material of the upper electrode (the electrode 3) of each memristor needs to satisfy the relation (the work function of the electrode 1)<(the work function of the electrode 3)<(the work function of the electrode 2) as described above. In the case of silicon or GaAs, for example, the electron affinity is approximately 4.1 eV, and therefore the work function of a highly-doped n-type semiconductor is 4.1 eV, and the work function of a highly-doped p-type semiconductor is 5.2 eV or 5.6 eV, respectively, When these semiconductors are used as the lower electrodes (the electrodes 1 and 2), the work function W of the material to be used for the upper electrode needs to satisfy $4.1 \leq W \leq 5.2$ ev (silicon), 5.6 eV (GaAs). Examples of metals that satisfy this relation include, in addition to Ag (4.3 eV) mentioned above, Al (4.2 eV), Ta (4.2 eV), Mo (4.5 ev), W (4.5 eV), Co (4.5 eV), Cr (4.5 eV), Cu (4.5 eV), Ru (4.7 eV), Au (4.7 ev), Pd (4.9 eV), Ni (5.2 eV; only in the case of GaAs), Ir (5.4 eV; only in the case of GaAs), and TIN (4.7 eV). Alternatively, when InP is used, for example, the electron affinity is approximately 4.4 eV, and therefore the work function of a highly-doped n-type semiconductor is 4.4 eV and the work function of a highly-doped p-type semiconductor is 5.8 eV, In this case, examples of the upper electrode include Mo (4.5 eV), W (4.5 eV), Co (4.5 eV), Cr (4.5 eV), Ru (4.7 ev), Au (4.7 eV), Pd (4.9 eV), Ni (5.2 eV), Ir (5.4 eV) and Pt (5.7 eV).

Next, an exemplary operation of the latch circuit 100 according to the present embodiment will be described. The operation of the latch circuit 100 is controlled by a control circuit that is not illustrated. The control circuit controls the voltages to be applied to the respective electrodes (1, 2 and 3) to control the operation of the latch circuit 100. Herein, a state in which the memristor A becomes open and the memristor B becomes closed is defined as "logic 0", and a state in which the memristor A becomes closed and the memristor 3 becomes open is defined as "logic 1". In addition, a state in which the memristor A and the memristor B become open is defined as "reset".

Figure 12:
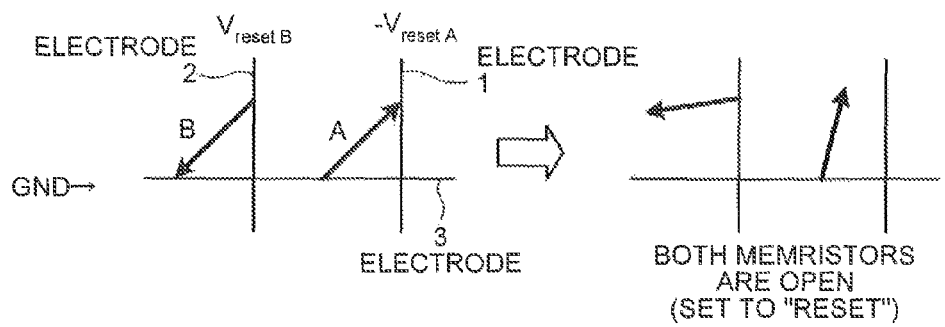
FIG. 12 is a diagram illustrating an exemplary operation of the latch circuit according to the first embodiment.

Before starting the operation of the latch circuit 100, the control circuit sets the state of the latch circuit 100 to "reset". More specifically, as illustrated in FIG. 12, the control circuit controls the voltage to be supplied to the electrode 3 to GND (0 V, for example), the voltage to be supplied to the electrode 1 to $-V_{resetA}$ (<GND), and the voltage to be supplied to the electrode 2 to $V_{resetB}$ (>GND). In this case, it can be said that a positive voltage bias ($+V_{resetA}$) is applied to the upper electrode (the electrode 3) of the memristor A and that a negative voltage bias ($-V_{resetB}$) is applied to the upper electrode (the electrode 3) of the memristor 3.

Figure 13:
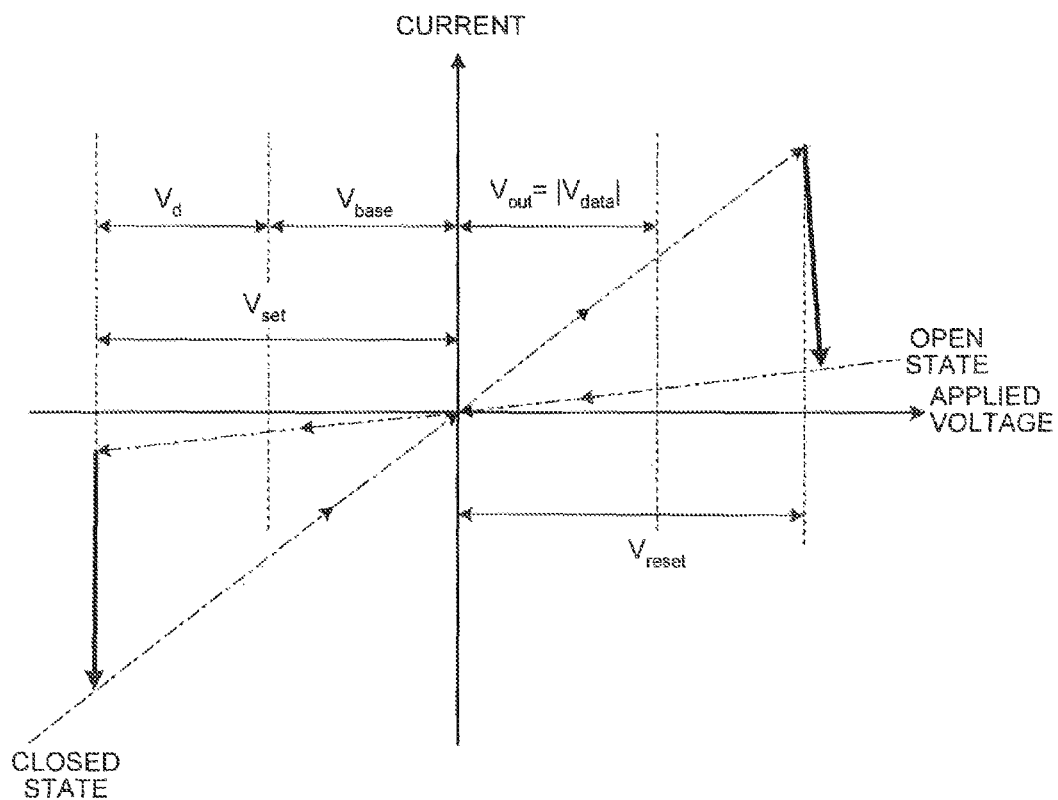
FIG. 13 illustrates a conceptual diagram, of operation of the latch circuit according to the first embodiment.

FIG. 13 illustrates a conceptual diagram of operations of the memristors (A, and B). Herein, the memristors make transitions to open when the voltage bias applied to the upper electrode (the electrode 3) exceeds $V_{reset}$. In the example of FIG. 12, since the voltage bias applied to the upper electrode of the memristor A is $|+V_{resetA}|>V_{reset}$ and the voltage bias applied to the upper electrode of the memristor B is $|-V_{resetB}|>V_{reset}$, both of the memristor A and the memristor E make transitions to open. As a result, the state of the latch circuit 100 is set to "reset".

Figure 14:
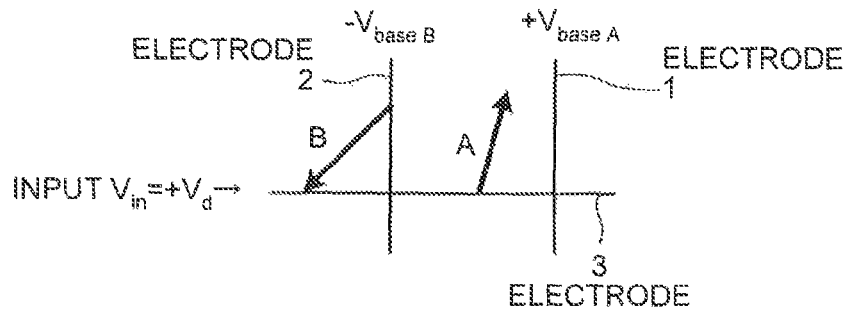
FIG. 14 is a diagram illustrating a "logic 0" state of the latch circuit according to the first embodiment.
Figure 15:
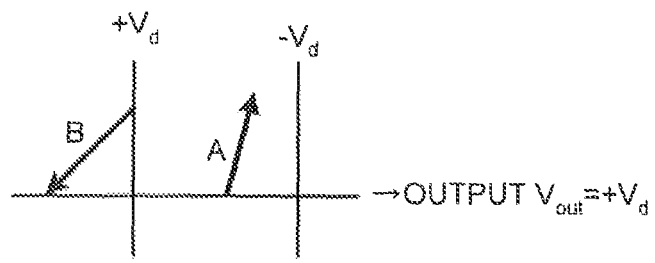
FIG. 15 is a diagram illustrating an output, process of the "logic 0" state of the latch circuit according to the first embodiment.

Next, a case in which the state of the latch circuit 100 is set from "reset" to "logic 0" will be described. In this case, as illustrated in FIG. 14, the control, circuit applies a voltage of $+V_d$ (>0) to the electrode 3, a voltage of $-V_{baseB}$ (<0) to the electrode 2, and a voltage of $+V_{baseA}$ (>0) to the electrode 1. In this case, it can be said that a positive voltage bias ($V_d+V_{baseB}$) is applied to the upper electrode (the electrode 3) of the memristor B. As can be understood from FIG. 13, a memristor makes a transition to closed if $V_d+V_{base}>V_{set}$ is satisfied. Since $(V_d+V_{baseB})>V_{set}$ is satisfied in the example of FIG. 14, the memristor B makes a transition to closed. Since the voltage bias $|V_d-V_{baseA}|$ applied to the upper electrode (the electrode 3) of the memristor A is a sufficiently small value (lower than $V_{set}$), on the other hand, the memristor A remains open. In this manner, data are stored in the latch circuit 100. Since memristors are nonvolatile, the memristor E remains in the closed state and. the memristor A remains in the open state even when power is turned off. In order to output the "stored data", the control circuit controls the voltage to be applied to the electrode 2 to $+V_d$ and the voltage to be applied to the electrode 1 to $-V_d$ as illustrated in FIG. 15, As a result, $+V_d$ is output to the electrode 3 (output $V_{out}=+V_d$).

Figure 16:
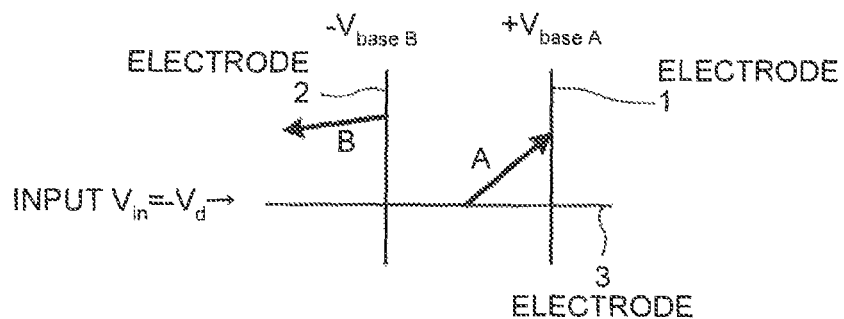
FIG. 16 is a diagram illustrating a "logic 1" state of the latch circuit according to the first embodiment.
Figure 17:
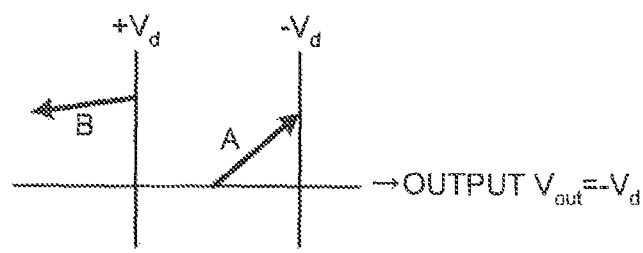
FIG. 17 is a diagram illustrating an output process of the "logic 1" state of the latch circuit according to the first embodiment.

Next, a case in which the state of the latch circuit 100 is set from "reset" to "logic 1" will be described. In this case, as illustrated in FIG. 16, the control circuit applies a voltage of $-V_d$ to the electrode 3, a voltage of $-V_{baseB}$ to the electrode 2, and a voltage of $+V_{baseA}$ to the electrode 1. In this case, it can be said that a negative voltage bias $-V_d-V_{baseA}$) is applied to the upper electrode (the electrode 3) of the memristor A. Since $|-V_d-V_{baseA}|>V_{set}$ is satisfied in the example of FIG. 16, the memristor makes a transition to closed. Since the voltage bias $|-V_d-V_{baseB}|$ applied to the upper electrode (the electrode 3) of the memristor B is a sufficiently small value (lower than $V_{set}$), on the other hand, the memristor B remains open. In this manner, data are stored in the latch circuit 100. Since memristors are nonvolatile, the memristor B remains in the open state and the memristor A remains in the closed state even when power is turned off. In order to output the "stored data", the control circuit controls the voltage to be applied to the electrode 2 to $+V_d$ and the voltage to be applied to the electrode 1 to $-V_d$ as illustrated in FIG. 17, As a result, $-V_d$ is output to the electrode 3 (output $V_{out}=-V_d$).

Herein, the voltage $V_d$ to be applied to the electrode 3 is controlled to be a relatively small voltage (a voltage smaller than $V_{set}$ and $V_{reset}$) so as to suppress occurrence of state transitions other latch circuits and memristors on the way of the transmission channel, while $V_{baseA}$ and $-V_{baseB}$ are supplementarily applied to the electrode 1 and the electrode 2, respectively, so that the memristors A and B make state transitions.

Next, an example of a method for manufacturing the latch circuit 100 according to the present embodiment will be described with reference to FIG. 18. First, an insulating film 11 is formed on the substrate 10 ((a) of FIG. 18), The insulating film 11 is made of $SiO_2$, for example, and has a thickness of 50 nm, for example. In the following, an example in which the insulating film 11 is made of $SiO_2$ will be described. Next, a trench extending along the direction (a Y direction in FIG. 18) perpendicular to the paper surface is formed in the insulating film 11 using lithography and etching technologies ((b) of FIG. 18). The width (the size in an X direction perpendicular to the Y direction) of the trench is about a minimum processing size f. If the substrate 10 is conductive, the trench is made shallower than the thickness of the insulating film 11 so that the insulating film 11 regains at the bottom of the trench. If the substrate 10 is insulating, the trench may reach, the surface of the substrate 10.

Figure 18:
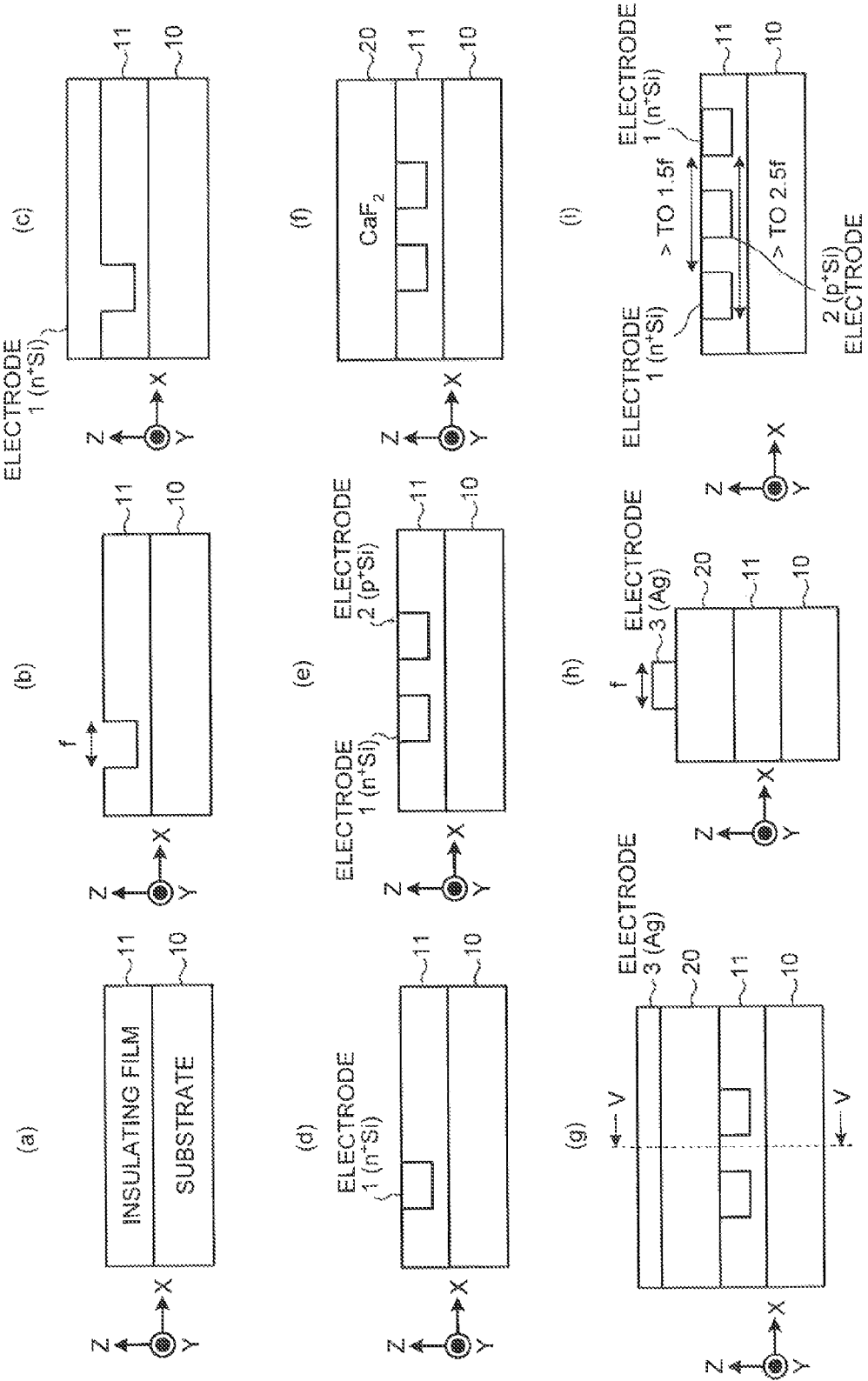
FIG. 18 is a diagram illustrating an example of a method for manufacturing the latch circuit according to the first embodiment.

Next, the material of the electrode 1 is deposited by a method such as the chemical vapor deposition (CVD) and sputtering to fill the trench with the material (the first material) of the electrode 1 ((c) of FIG. 18). As described above, the first material is preferably not easily ionizable. Herein, an example in which the first material is $n^+Si$ is described. Next, $n^+Si$ is reduced in a Z direction until the upper surface (the surface) of the insulating film 11 is exposed by a method such as the chemical mechanical planarization (CMP) or the reaction ion etching (RIE) ((d) of FIG. 18). As a result, a structure in which $n^+Si$ is buried in a form of a line in the insulating film 11 is obtained.

Next, a trench parallel, to the $n^+Si$ line of the electrode 1 is formed in the insulating film 11 by using lithography and etching technologies, and the trench is filled with the material (the third material) of the electrode 2 similarly to the case of the electrode 1 ((e) of FIG. 18). The third material is preferably a material that has a larger wok function than the electrode 3 (the upper electrode) and that is not easily ionizable. Herein, an example in which the third material is $p^+Si$ is described.

The resistive switching film 20 is formed over the line pattern of $n^+Si$ and the line pattern of $p^+Si$ formed as described above. The resistive switching film 20 is a thin film of $CaF_2$, for example, and has a thickness of about 10 to 100 nm, for example ((f) of FIG. 18), Herein, an example in which the resistive switching film 20 is $CaF_2$ is described. Next, a line pattern of the material (the second material) of the electrode 3, which extends in the direction (the X direction in FIG. 18) perpendicular to the direction in which the $n^+Si$ line pattern and the $p^+Si$ line pattern extend and which intersects each of the $n^+Si$ line pattern and she $p^+Si$ line pattern as viewed in the normal direction (the Z direction, in FIG. 18) of the substrate 10, is formed on the upper surface of the resistive switching film 20 ((g) of FIG. 18). The second material is Ag, for example, and has a thickness of about 10 to 100 nm, for example. Illustrated in (h) of FIG. 18 is a cross section taken along line V-V of (g) of FIG. 18. As illustrated in (h) of FIG. 18, the width (the size in the Y direction) of the line is f or smaller. In addition, the line pitch is 2 f. The methods for deposition of the material (the second material) of the electrode 3 and patterning the line are equivalent to a typical LSI wiring process, and detailed description thereof will not be provided. The latch circuit 100 of FIG. 2 is formed as described above.

Note that the overlay accuracy of the lithography is about 20% of the minimum processing size. Accordingly, for burying the electrode 2 ($p^+Si$ line) between two electrodes 1 ($n^+Si$ lines), the interval between the $n^+Si$ lines need to be designed to be 1.5 f or larger as illustrated in (i) of FIG. 18 taking an overlay shift of about ±20% into account. This means that the minimum, width occupied by a pair of the $n^+Si$ line and the p+Si, that is, the minimum pitch, of the pair is 1.5 f+1 f (the width of the n+Si line)=2.5 f. On the other hand, the minimum pitch of the electrode 3 (the upper electrode) is 2 f as described above. Accordingly, the minimum size of the latch circuit 100 is 2.5 f×2 f=5 f$^2$.

Figure 19A:
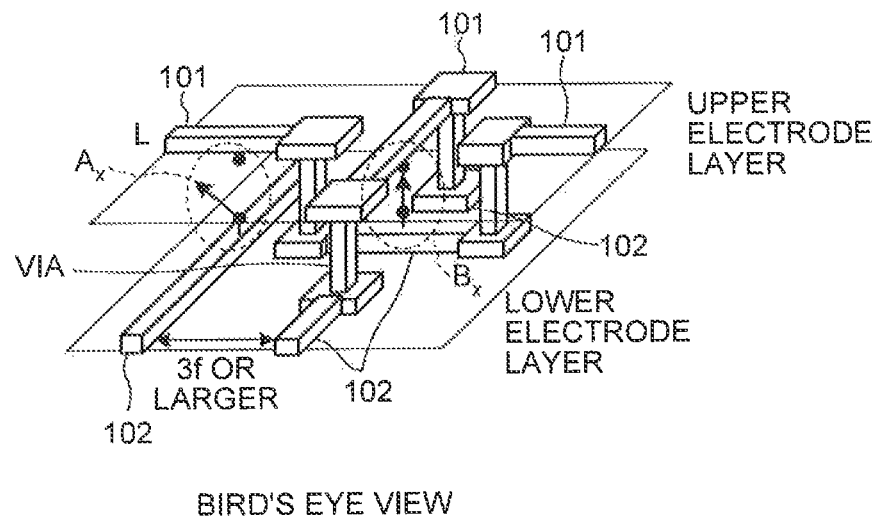
FIG. 19A is a conceptual diagram of a structure of a latch circuit as a comparative example.
Figure 19B:
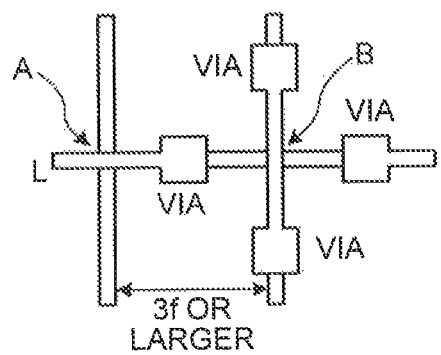
FIG. 19B is a top view of the latch circuit of FIG. 19A.

As a comparative example, FIG. 19A illustrates a structure of a latch circuit in which two types of electrode materials (101 and 102) are used to form memristors $A_x$ and $B_x$, and FIG. 19B is a top view of FIG. 19A, In this example, in order to make the two memristors ($A_x$ and $B_x$) operate complementarily to each other, a lower electrode of one memristor $A_x$ and an upper electrode of the other memristor $B_x$ need to be connected, for example. Accordingly, in the example of FIGS. 19A and 19B, a via is provided between an upper electrode layer and a lower electrode layer to connect the lower electrode of one memristor $A_x$ and the upper electrode of the other memristor $B_x$. In other words, in the example of FIGS. 19A and 19B, an area for forming the via needs to be ensured, and the wiring interval in one wiring layer will, be about 3 f or larger where f is the minimum processing size. Accordingly, the pitch in the lower electrode layer will be 6 f and the pitch in the upper electrode layer will be 3 f in one latch circuit, and an area of about 18 f$^2$ or larger per one latch circuit will be required.

Figure 20:
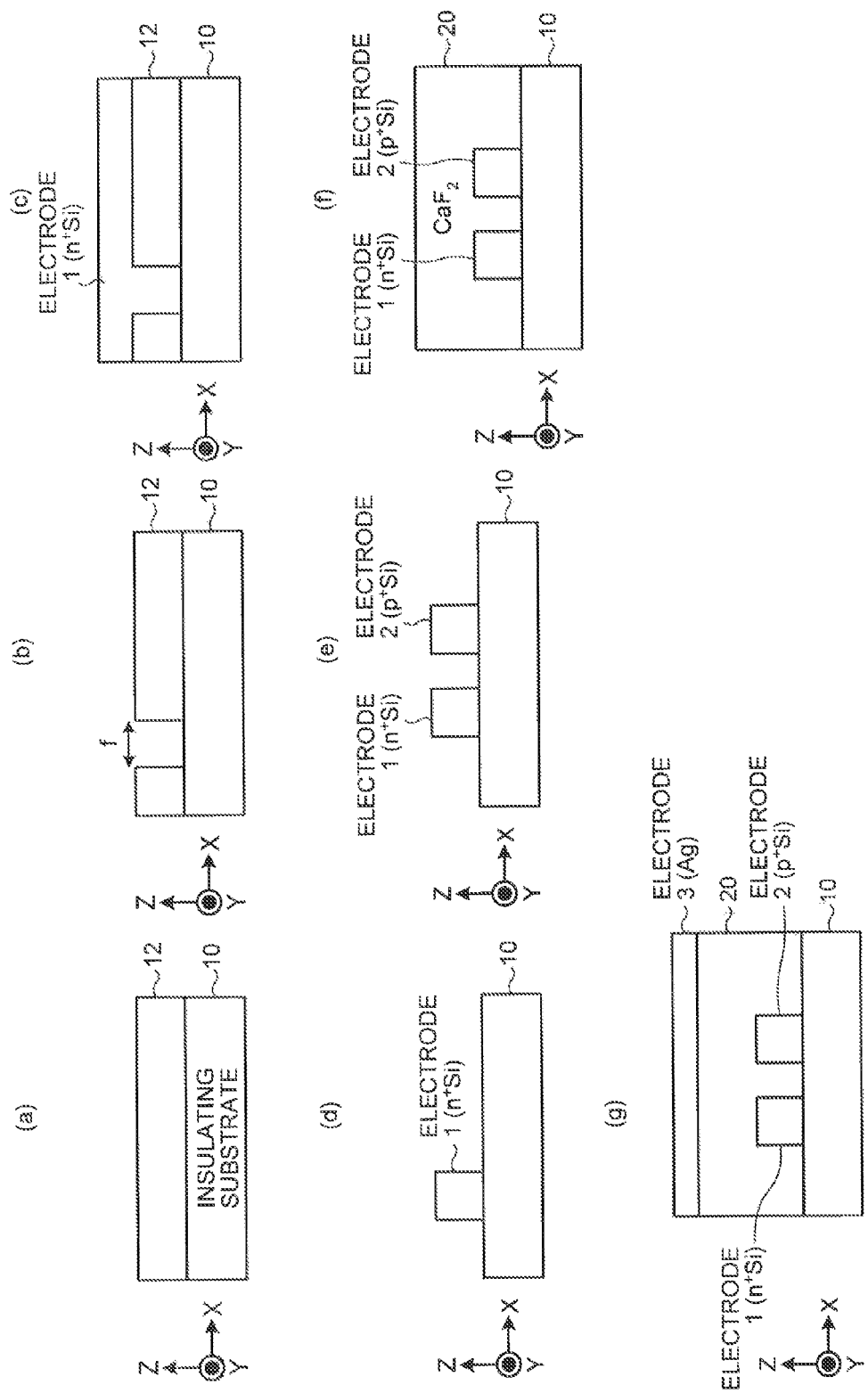
FIG. 20 is a diagram illustrating another manufacturing method as Modification 1.

In contrast, in the present embodiment, since it is not necessary to wire the lower electrode of one memristor to the upper electrode of the other memristor, the area for forming a via is not needed. it is therefore possible to make the area necessary for forming one latch circuit on the substrate 10 small as compared to the example of FIGS. 19A and 19B. As described above, in the present embodiment, the minimum size of the area necessary for forming one latch circuit on the substrate 10 can be as small as 5 f$^2$. Since it is desirable to make the area of a latch circuit small from the viewpoint of increasing the density of LSI devices, the structure of the present embodiment that can reduce the minimum size of the latch circuit is significantly advantageous, Modification 1 of First Embodiment Next, another example of the method for manufacturing the latch circuit will be described with reference to FIG. 20. While a method of forming the electrode 1 and the electrode 2 in a manner being buried in the insulating film 11 is described in the example of (a) to (i) of FIG. 18, the electrode 1 and the electrode 2 may be formed on the substrate 10 without providing the insulating film 11 as in the example of FIG. 20 when the substrate 10 is insulating. First, a resist 12 is applied on the substrate (insulating substrate) 10 ((a) of FIG. 20). Next, a trench extending along the Y direction is formed in the resist 12 using lithography and etching technologies ((b) of FIG. 20). The width (the size in the X direction) of the trench is about the minimum processing size f. Next, the material (n+Si in this case) of the electrode 1 is deposited by a method such as the CVD and sputtering to fill the trench with the material of the electrode 1 ((c) of FIG. 20). Next, the resist is removed by an organic solvent or the like and as a result, only a line of the material of the electrode 1 remains on the substrate 10 ((d) of FIG. 20). Similarly, a line of the material (p+Si in this case) of the electrode 2 that is parallel to the line of the material of the electrode 1 is formed on the substrate 10 ((e) of FIG. 20), As described above, the minimum pitch of the pair of the line of the electrode 1 and the line of the electrode 2 is 2.5 f on the basis of the overlay accuracy of the lithography. Subsequently, the resistive switching film 20 is formed ((f) of FIG. 20) and the electrode 3 (the upper electrode) is formed (FIG. 20 (g)) similarly to the case in (a; to (i) of FIG. 16. Similarly to (i) of FIG. 18, the minimum: size of the latch circuit 100 is 25 f×2 f=5 f$^2$.

Modification 2 of First Embodiment

Next, still another example of the method for manufacturing the latch circuit will be described with reference to FIG. 21. If the electrodes 1 and 2 are made of semiconductors, it is possible to form the electrodes by a method or implantation of different ions. An example thereof is illustrated in FIG. 21.

Figure 21:
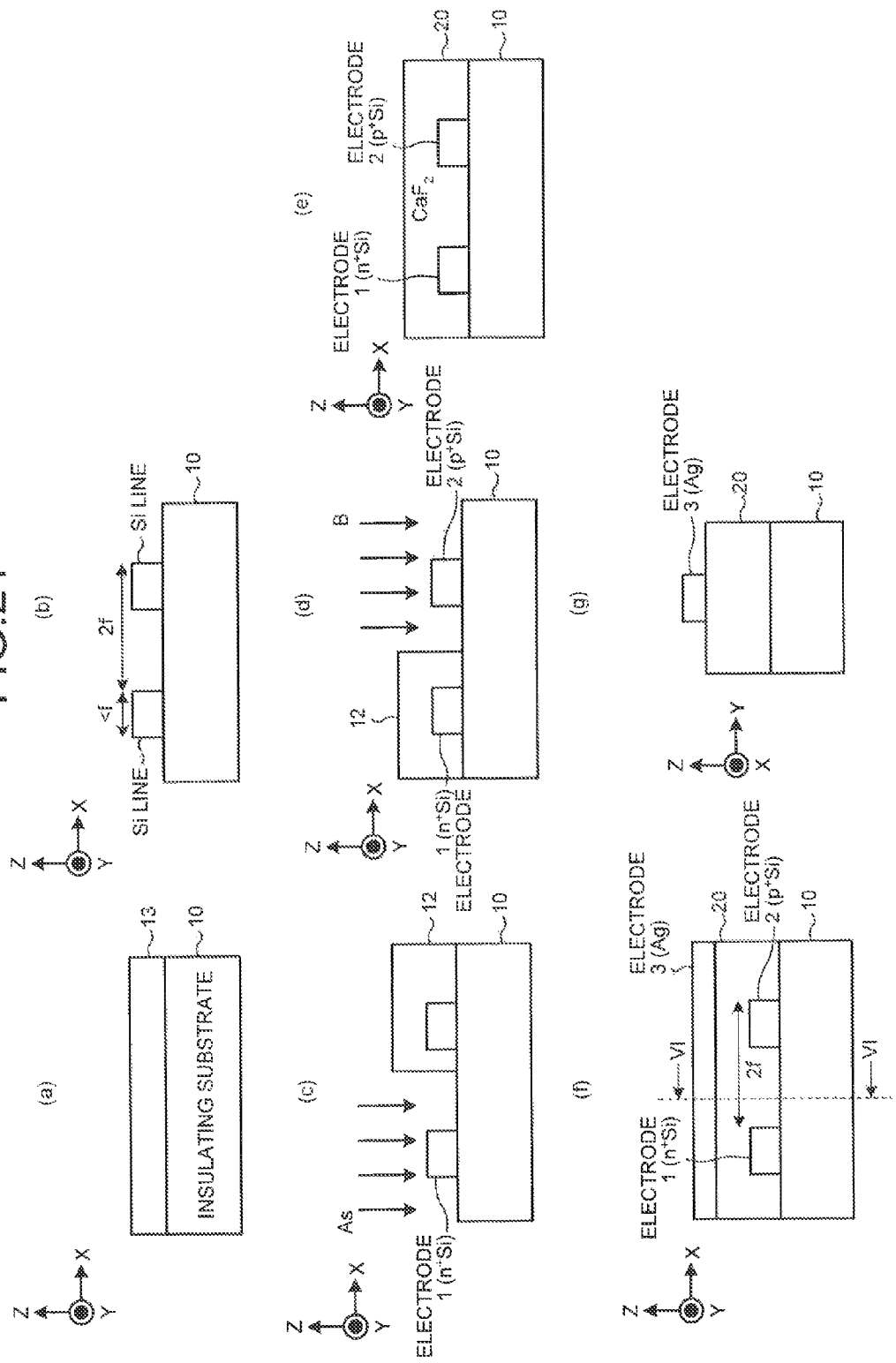
FIG. 21 is a diagram illustrating still another manufacturing method according to Modification 2.

First, an undoped semiconductor or a lightly-doped semiconductor 13 with an impurity concentration smaller than $1×10^{18}$ cm$^{-3}$ is formed on the insulating substrate 10 ((a) of FIG. 21). In the following, an example in which the doped semiconductor 13 is made of undoped Si will be described. Next, the doped semiconductor 13 is processed to form two Si lines extending parallel to each, other in the Y direction on the substrate 10 by using lithography and etching technologies ((b) of FIG. 21). The width of the Si lines can be f or smaller than f by means of a slimming technology. The pitch of the Si lines is 2 f.

Next, only one of the adjacent Si lines is covered with a resist 12 by lithography. Since the minimum interval, of the lines is about f, it is possible to cover only one of the adjacent Si lines with the resist 12 with the overlay accuracy of the lithography of ±0.2 f. Ion implantation of a donor impurity is performed using the resist 12 as a mask ((c) of FIG. 21). The donor impurity is As, for example. As a result a line of n+Si (a line of the electrode 1) if formed on the substrate 10.

Similarly, the Si line into which As is implanted is covered with the resist 12, and ion implantation, of an acceptor impurity is performed only to the Si line to which As is not implanted ((d) of FIG. 21). The acceptor impurity is B, for example. After implantation of impurities, heat treatment is performed so as to activate the impurities where necessary. As a. result, a line of p+Si (a line of the electrode 2) is formed on the substrate 10.

Next, the resistive switching film 20 is formed so as to cover the electrode 1 and the electrode 2 ((e) of FIG. 21). The resistive switching film 20 is a CaF$_2$ film, having a thickness of 10 to 100 nm, for example. After forming the resistive switching film 20, the electrode 3 (the upper electrode) is formed on the upper surface of the resistive switching film 20 ((f) and (g) of FIG. 21).

More specifically, similarly to the example of (a) to (i) of FIG. 18, a line pattern of the electrode 3, which extends in the direction (the X direction) perpendicular to the direction in which the electrode 1 and the electrode 2 extend and which intersects each of the line pattern of the electrode 1 and the line pattern of the electrode 2 as viewed in the normal direction (the Z direction) of the substrate 10, is formed on the upper surface of the resistive switching film 20, Note that (g) of FIG. 21 is a diagram illustrating a cross section taken along line VI-VI in (f) of FIG. 21.

Modification 3 of First Embodiment

Figure 22:
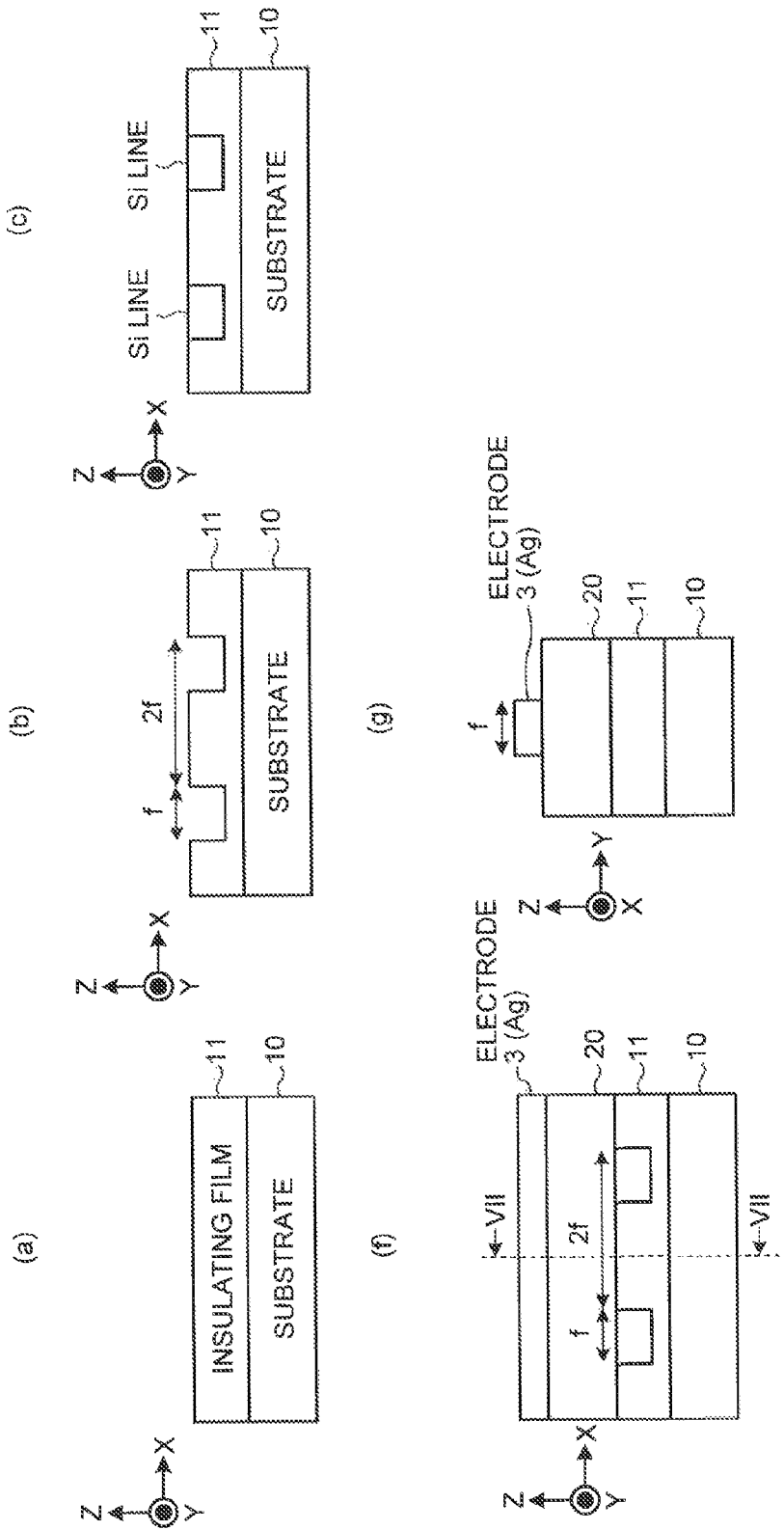
FIG. 22 is a diagram illustrating yet still another manufacturing method according to Modification 3.

While the method of forming an undoped Si (an intrinsic semiconductor material) on the insulating substrate 10 and patterning the undoped Si in a form of lines is described in the example of FIG. 21, the lines for the electrodes 1 and 2 may alternatively be formed by a method of burying the lines in an insulating film 11 as illustrated in FIG. 22, for example. First, the insulating film 11 is formed on the substrate 10 ((a) of FIG. 22). Next, two trenches extending parallel to each other along the direction (the Y direction) perpendicular to the paper surface is formed in the insulating film 11 using lithography and etching technologies ((b) of FIG. 22), and the trenches are filled with undoped Si (FIG. 22(c)). Since the filling method is the same as that in (a) to (d) of FIG. 18, detailed description thereof will not be repeated. Since the processes after the filling are the same as those in (c) to (g) of FIG. 21, detailed description thereof will not be repeated.

Finally, the structure illustrated in (f) of FIG. 22 and (g) of FIG. 22 that is a cross section taken along line VII-VII of (f) of FIG. 22 is obtained.

In the examples of the manufacturing method of FIGS. 21 and 22, since the lines for the electrodes 1 and 2 are formed by patterning the undoped Si through one process of lithography; the minimum pitch of the lines is 2 f as illustrated in (f) of FIG. 21 and (f) of FIG. 22. Accordingly, the minimum, pitch is 4 f for a pair of the electrode 1 and the electrode 2. Since the minimum pitch of the upper electrode (the electrode 3) is 2 f, the minimum area of the latch circuit will be 4 f×2 f= 8 f².

Modification 4 of First Embodiment

Next, yet still another example of the method for manufacturing the latch circuit will be described with reference to FIG. 23. In the methods described so far, the electrodes 1 and 2 are formed differently through lithography. Accordingly, two or more lithography processes at high overlay accuracy is needed, and the manufacture cost is therefore high. In the following, therefore, an example of the manufacturing method in which the number of lithography processes is one will be described.

Figure 23:
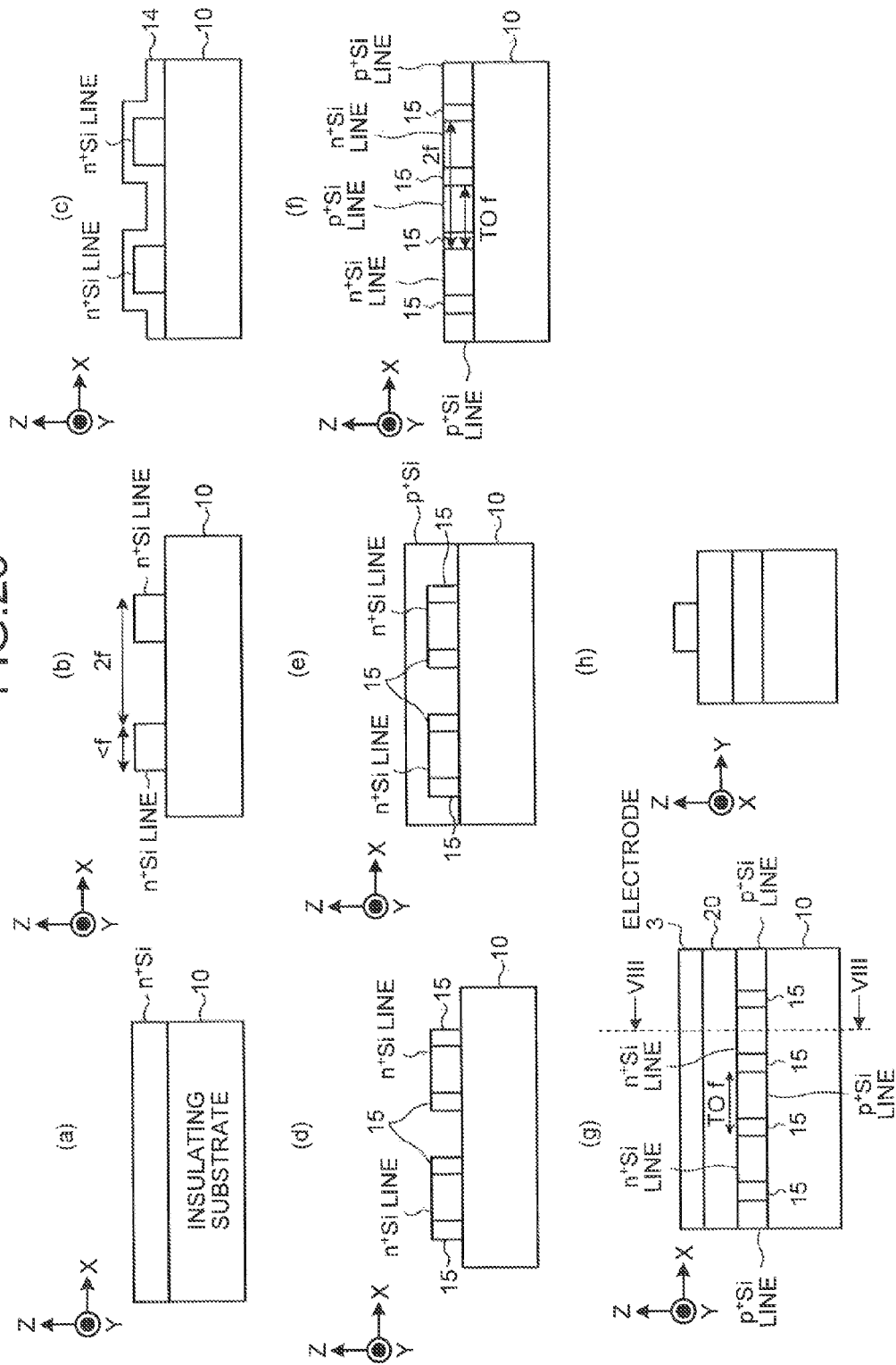
FIG. 23 is a diagram illustrating yet still another manufacturing method according to Modification 4.

First, the material (the first material) of the electrode 1 is deposited on. the insulating substrate 10 by a method such as the CVD ((a) of FIG. 23). The first material is $n^+Si$, for example, and has a thickness of about 20 nm, for example. Herein, an example in which the first material is $n^+Si$ is described. Next, the deposited $n^+Si$ is processed to form two $n^+Si$ lines extending parallel to each other in the Y direction on the substrate 10 by using lithography and etching technologies ((b) of FIG. 23). When the minimum processing size of the lithography is f, the pitch of the $n^+Si$ lines is 2 f. The lines of the mask material can be formed to have a width (a size in the X direction) of about f, and can also be reduced to smaller than f by means of slimming as necessary.

Next, a side wall material 14 that covers the $n^+Si$ lines if formed on the substrate 10 ((c) of FIG. 23). The side wall material 14 is an insulator such as SiN of $SiO_2$ having a thickness of about 5 nm, for example. Next, the side wail material 14 is etched so that side walls 15 are formed on side surfaces of the $n^+Si$ lines by using an etching technology with a high straightness such as RIE ((d) of FIG. 23). As a result of using the etching technology with a nigh straightness, it is possible to allow the side wall material 14 to remain on side surfaces of the $n_+Si$ lines to form the side walls 15.

Next, the material (the third material) of the electrode 2 is deposited on the substrate 10 so as to cover the $n^+Si$ lines formed with the side walls 15 by a method such as the CVD or sputtering ((e) of FIG. 23). Herein, an example in which the third material is $p^+Si$ is described. Next, $p^+Si$ is reduced in the Z direction until the $n^+Si$ lines are exposed by a method such as the CMP or the RIE ((f) of FIG. 23). As a result, the $n^+Si$ lines and the $p^+Si$ lines are arranged alternately ((f) of FIG. 23). The $n^+Si$ lines and the $p^+Si$ are electrically insulated by the side wails 15. The side walls 15 may be removed by a method such as wet etching. Since air gaps remain between the $n^+Si$ lines and the $p^+Si$ lines even if the side walls 15 are removed, the $n^+Si$ lines and the $p^+Si$ are electrically insulated from, one another.

Next, the resistive switching film 20 is formed on the upper surfaces of the $n^+Si$ line pattern and the $p^+Si$ line pattern, and the upper electrode (the electrode 3) is formed on the formed resistive switching film 20 ((g) of FIG. 23 and (h) of FIG. 23 that is a cross section taken along line VIII-VIII of (h) of FIG. 23), The resistive switching film 20 is a $CaF_2$ thin film having a thickness of 10 to 100 nm, for example. The upper electrode is a line electrode that extends in the direction (the X direction, perpendicular to the direction in which the $n^+Si$. line pattern and the $p^+Si$ line pattern extend and that intersects each of the $n^+Si$ line pattern and the $p^+Si$ line pattern as viewed in the normal direction (the Z direction) of the substrate 10), and the material, thereof is Ag, for example.

In the latch circuit produced by the manufacturing method described above, since the pitch of the lines of the electrodes 1 is 2 f and the electrodes 2 are formed between the electrodes 1, the minimum pitch of pairs of the electrodes 1 and 2 is 2 f, Since the minimum pitch of the upper electrode (the electrode 3) is 2 f, the minimum area of the latch circuit is 2 f×2 f=4 f², and it is thus possible to further reduce the size of the latch circuit.

Second Embodiment

Next, a second embodiment will be described. Parts that are the same as those in. the first embodiment described above will be designated by the same reference numerals and description thereof will not be repeated as appropriate. The second embodiment is different from the first embodiment in that the electrode 1 and the electrode 2 are formed on an upper surface of a wiring layer formed on the surface of the substrate 10. Specific description thereof will be given below.

Figure 24:
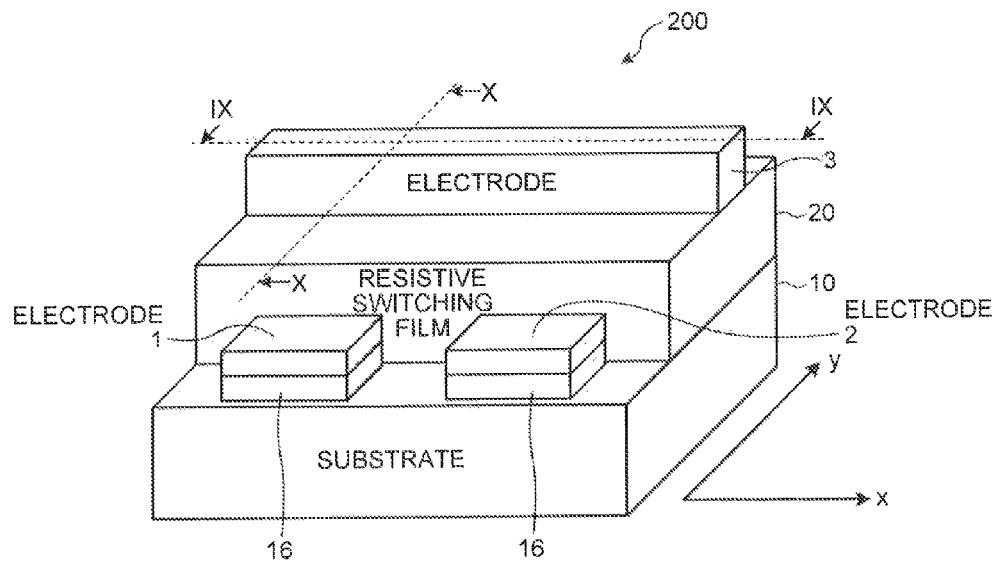
FIG. 24 is a bird's eye view illustrating an exemplary structure of a latch circuit according to a second embodiment.

FIG. 24 is a bird's eye view illustrating an exemplary structure of a latch circuit 200 according to the second embodiment. As illustrated in FIG. 24, an electrode 1 and an electrode 2 extending parallel to each other along a Y direction are formed on a substrate 10. Furthermore, a resistive switching film 20 is formed to cover both of the electrode 1 and the electrode 2, and an electrode 3 extending along an X direction perpendicular to the Y direction, is formed on an upper surface of the resistive switching film 20, When viewed in the normal direction, of the substrate 10, the electrode 3 intersects each of the electrode 1 and the electrode 2.

Figure 25:
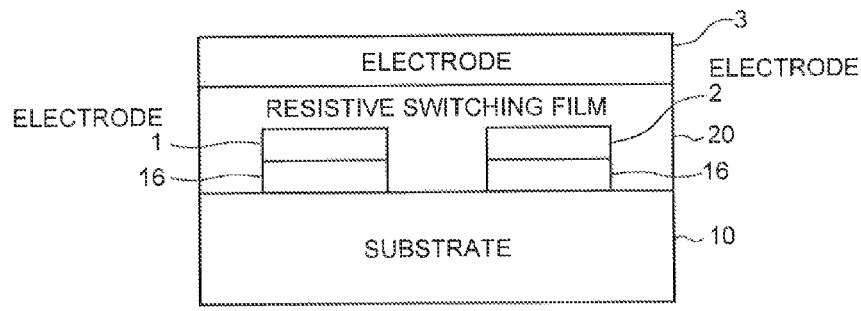
FIG. 25 is a sectional view of the latch circuit taken along line IX-IX of FIG. 24.
Figure 26:
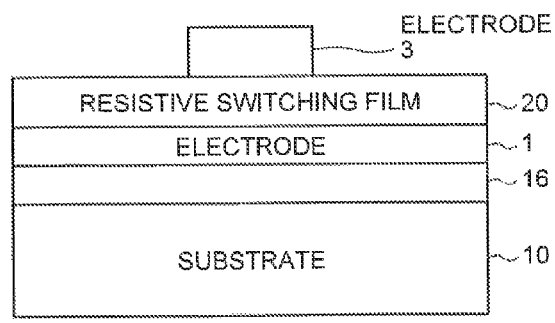
FIG. 26 is a sectional view of the latch circuit taken along line X-X of FIG. 24.

A wiring layer 16 formed of a material with a lower resistivity than the materials of the electrode 1 and the electrode 2 is arranged between the electrodes 1 and 2 and the substrate 10, As a result of connecting such a wiring layer 16 to each of the first, electrode and the second electrode, it is possible to decrease the resistances in the Y direction, or the electrode 1 and the electrode 2. In other words, the wiring layer 16 serves to decrease the resistances in the Y direction of the electrode 1 and the electrode 2, A section taken along line IX-IX in the exemplary structure or FIG. 24 is illustrated in FIG. 25, and a section taken along line X-X therein is illustrated in FIG. 26.

Similarly to the first embodiment, the electrode 3 and the electrode 1 have the resistive switching film 20 therebetween at the intersection thereof to form a memristor A, and the electrode 3 and the electrode 2 nave the resistive switching film 20 therebetween at the intersection thereof to form a memristor 3, The electrode 1 and the electrode 2 are made of semiconductors, for example, and the material of the electrode 1 is $n^+Si$ while the material of the electrode 2 is $p^+Si$, for example. The wiring layer 16 is made of a material with a lower resistivity than the materials of the electrode 1 and the electrode 2, For example, when the electrodes I and 2 are made of semiconductors, metal or the like is preferable as the material of the wiring layer 16, Examples of such metal may include a metal having high heat resistance and low reactivity such as W, Mo, and TiN. Examples thereof may further include an easily processable metal such as Al and Cu. The wiring layer 16 may have a multilayered structure of two or more metals.

Third Embodiment

Next, a third embodiment will, be described. Parts that are the same as those in the embodiments described above will be designated by the same reference numerals and description thereof will, not be repeated as appropriate. The third embodiment, is different from the embodiments described above in that the electrode 1 and the electrode 2 function, as upper electrodes and that the electrode 3 functions as a lower electrode. Specific description thereof will be given below.

Figure 27:
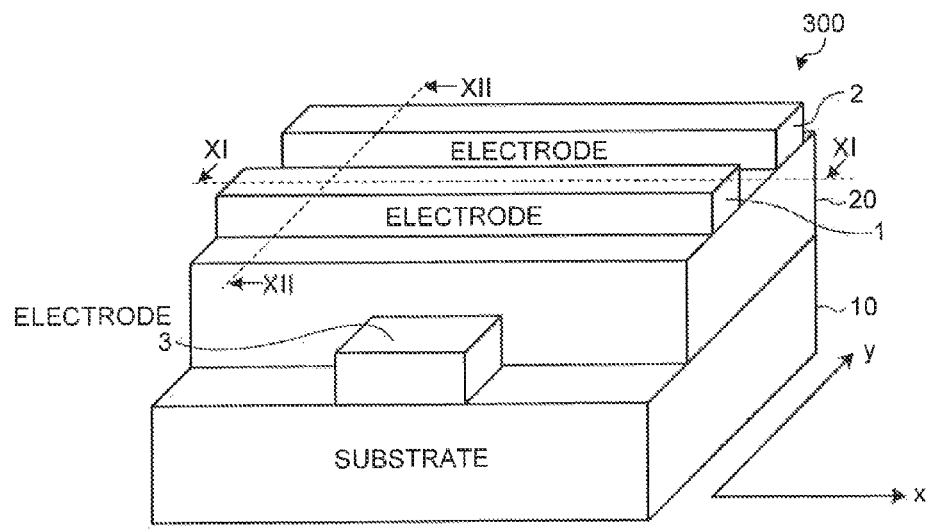
FIG. 27 is a bird's eye view illustrating an exemplary structure of a latch circuit according to a third embodiment.
Figure 28:
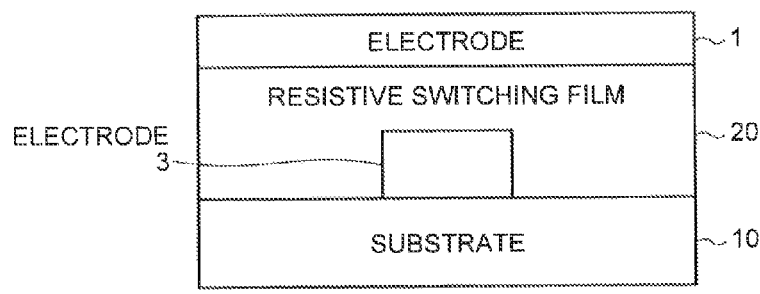
FIG. 28 is a sectional view of the latch circuit taken along line XI-XI of FIG. 27.
Figure 29:
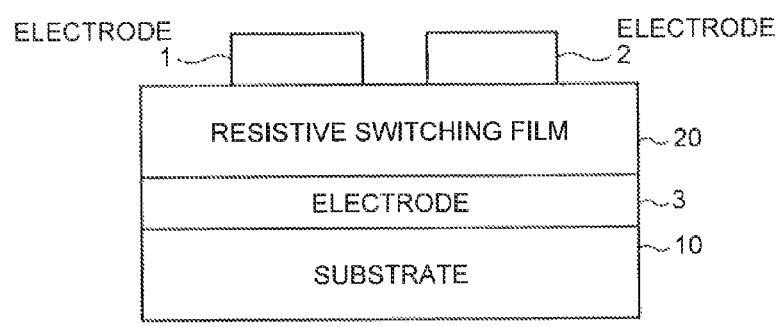
FIG. 29 is a sectional view of the latch circuit taken along line XII-XII of FIG. 27.

FIG. 27 is a bird's eye view illustrating an exemplary structure of a latch circuit 300 according to the third embodiment. As illustrated in FIG. 27, an electrode 3 extending along a Y direction is formed on a substrate 10. Furthermore, a resistive switching film 20 is formed to cover the electrode 3, and an electrode 1 and an electrode 2 extending parallel to each other along an X direction is formed on an upper surface of the resistive switching film 20. When viewed, in the normal direction of the substrate 10, the electrode 3 intersects each of the electrode 1 and the electrode 2. A section taken along line XI-XI in the exemplary structure of FIG. 27 is illustrated in FIG. 28, and a section taken along line XII-XII therein is illustrated in FIG. 29. The electrode 3 and the electrode 1 have the resistive switching film 20 therebetween at the intersection thereof to form a memristor A, and the electrode 3 and the electrode 2 have the resistive switching film 20 therebetween at the intersection thereof to form a memristor B. Since the present embodiment has a structure in which the electrodes 1 and 2 and the electrode 3 in the embodiments described above are replaced upside down and which is the same as those in the embodiments described above in all the other respects, detail description thereof will not be repeated.

Modification of Third Embodiment

Figure 30:
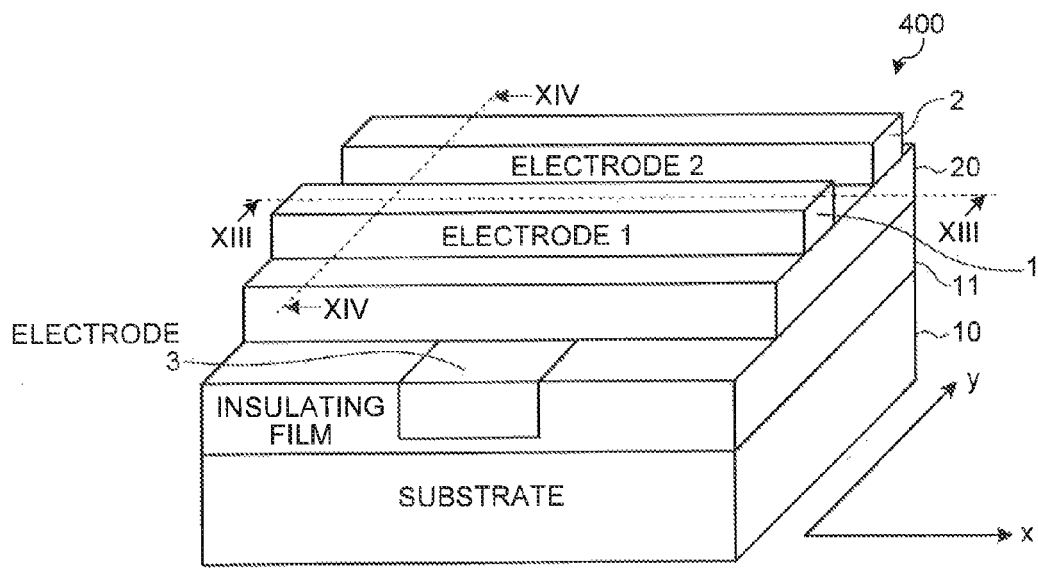
FIG. 30 is a bird's eye view illustrating an exemplary structure of a latch, circuit according to a modification.
Figure 31:
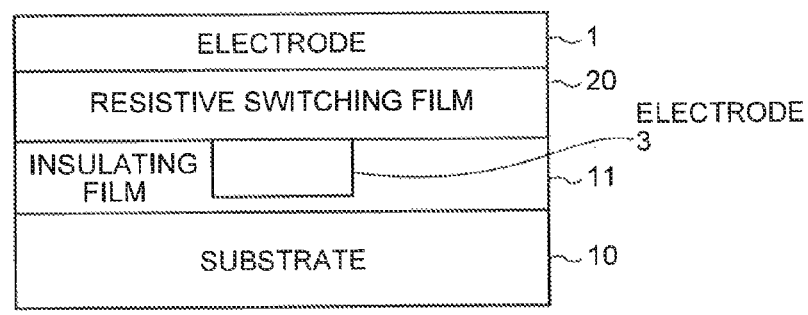
FIG. 31 is a sectional view of the latch circuit taken along line XIII-XIII of FIG. 30.
Figure 32:
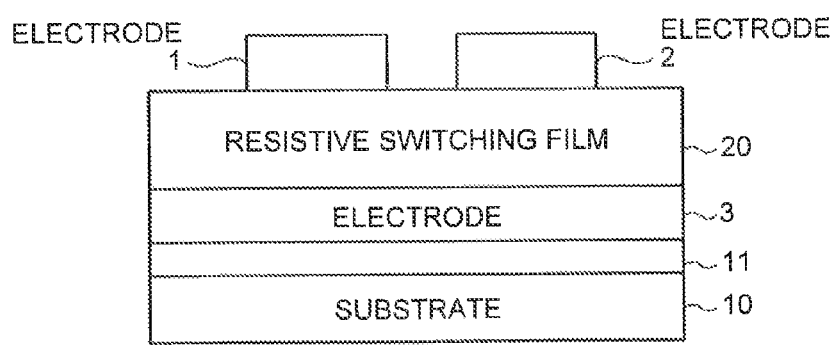
FIG. 32 is a sectional view of the latch circuit taken along line XIV-XIV of FIG. 30.

Note that a latch circuit, may have a structure in which the electrode 3 that functions as the lower electrode is Purled in an insulating film II. In this case, the insulating film 11 needs to be formed on the substrate 10 as in the example of (a) to (g) of FIG. 22. FIG. 30 is a bird's eye view illustrating a latch circuit 400 having a structure in which she electrode 3 is buried in the insulating film 11 formed on the surface of the substrate 10, A section taken along line XIII-XIII in the exemplary structure of FIG. 30 is illustrated in FIG. 31, and a section taken, along line XIV-XIV therein is illustrated in FIG. 32.

In the embodiments described above, the resistive switching film included, in each of the memristors (A, B) is a resistive switching film 20 that is shared by the memristors (A, B), Specifically, a form in which the "first resistive switching film" and the "second, resistive switching film" are formed integrally is described, but. alternatively, a form in which the "first resistive switching film" and the "second resistive switching film" are formed separately (noncontinuously) may be employed. According to the form in which the "first resistive switching film" and the "second resistive switching film" are formed integrally as in the embodiments described above, however, there is an advantage that the manufacture is easier than a case in which the "first resistive switching film" and the "second resistive switching film" are formed separately.

Basically, a semiconductor device (a latch circuit, for example) may be at least in a form including a first memristor (corresponding to the "memristor A" in the embodiments) that includes a first electrode (corresponding to the "electrode 1" in the embodiments) made of a first material, a second electrode (corresponding to the "electrode 3" in the embodiments) made of a second material, and a first resistive switching film (corresponding to the "resistive switching film 20" in the embodiments) that is arranged between the first electrode and the second electrode and that is connected to each of the first electrode and the second electrode; and a second memristor (the "memristor B" in the embodiments, for example) that includes a third electrode (corresponding to the "electrode 2" in the embodiments made of a third material, a fourth electrode (corresponding to the "electrode 3" in the embodiments) made of the second material, and a second, resistive switching film (corresponding to the "resistive switching film 20" in the embodiments) that is arranged between the third electrode and the fourth electrode and that is connected to each of the third electrode and the fourth, in which the work function of the first material is smaller than the work function of the second, material, and the work function of the third material is larger than the work function of the second material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described, herein may be made without departing from the spirit of the inventions. The accompanying claims and their equivalents are intended to cover such forms or modifications as would fail within the scope and spirit of the inventions.

What is claimed is:

1. A semiconductor device comprising;
a first memristor including a first electrode made of a first material, a second electrode made of a second material, and a first resistive switching film arranged between the first electrode and the second electrode, the first resistive switching film being connected to the first electrode and connected to the second electrode; and
a second memristor including a third electrode made of a third material, a fourth electrode made of the second material, and a second resistive switching film arranged between the third electrode and the fourth electrode, the second, resistive switching film being connected to the third electrode and connected to the fourth electrode, wherein
a work function of the first material is smaller than a work function of the second material, and
a work function of the third material is larger than the work function of the second material.

2. The device according to claim 1, wherein
the first memristor becomes a low resistance state when a potential difference between the first electrode and the second electrode has a first polarity,
the first memristor becomes a high resistance state when the potential difference between the first, electrode and the second electrode has a second polarity opposite to the first polarity,
the second memristor becomes a high resistance state when a potential difference between the third electrode and the fourth electrode has the first polarity,
the second memristor becomes a low resistance state when the potential difference between the third electrode and the fourth electrode has the second polarity.

3. The device according to claim 1, wherein the second electrode and the fourth electrode are formed integrally.

4. The device according to claim 1, wherein the first resistive switching film and the second resistive switching film are formed integrally.

5. The device according to claim 1, wherein the first material, is an n-type semiconductor, and the third material is a p-type semiconductor.

6. The device according to claim 5, wherein each of the n-type semiconductor and the p-type semiconductor contains silicon, and the second material contains a metal having a work function of 4.1 eV or larger.

7. The device according to claim 1, wherein each of the first resistive switching film and the second resistive switching film is an ion conductor.

8. The device according to claim 7, wherein each of the first resistive switching film and the second resistive switching film is a metal fluoride.

\* \* \* \* \*